United States Patent [19]

Miura et al.

[11] Patent Number: 4,739,381
[45] Date of Patent: Apr. 19, 1988

[54] PIEZORESISTIVE STRAIN SENSING DEVICE

[75] Inventors: Hideo Miura; Tatsuji Sakamoto; Asao Nishimura, all of Ibaraki, Japan

[73] Assignee: Hitachi, Ltd., Tokyo, Japan

[21] Appl. No.: 838,954

[22] Filed: Mar. 12, 1986

[30] Foreign Application Priority Data

Mar. 20, 1985 [JP] Japan .................................. 60-54473
Mar. 20, 1985 [JP] Japan .................................. 60-54474

[51] Int. Cl.⁴ .................... H01L 29/04; H01L 29/10; H01L 29/84
[52] U.S. Cl. ........................................ 357/26; 357/28; 357/60
[58] Field of Search .............................. 357/26, 28, 60

[56] References Cited

U.S. PATENT DOCUMENTS

| | | | |
|---|---|---|---|
| 3,123,788 | 3/1964 | Pfann et al. | 357/26 |
| 3,277,698 | 10/1966 | Mason | 357/60 |
| 3,492,861 | 2/1970 | Jund | 357/60 |
| 3,818,289 | 6/1974 | Mudge et al. | 357/60 |
| 3,899,695 | 8/1975 | Solomon et al. | 357/26 |
| 3,922,705 | 11/1975 | Yerman | 357/26 |
| 4,028,564 | 6/1977 | Streit et al. | 357/28 |
| 4,510,671 | 4/1985 | Kurtz et al. | 357/26 |
| 4,672,411 | 6/1987 | Shimizu et al. | 357/60 |

FOREIGN PATENT DOCUMENTS

| | | | |
|---|---|---|---|
| 56-140229 | 2/1981 | Japan | 357/26 |
| 56-60066 | 5/1981 | Japan | 357/26 |
| 57-95673 | 6/1982 | Japan | 357/26 |

OTHER PUBLICATIONS

Smith "Piezoresistance Effect . . . Silicon" *Physical Review*, vol. 94, No. 1, Apr. 1, 1954, pp. 42-49.

Primary Examiner—Andrew J. James
Assistant Examiner—Jerome Jackson
Attorney, Agent, or Firm—Antonelli, Terry & Wands

[57] ABSTRACT

A piezoresistive strain sensing device is comprised of a semiconductor single-crystal substrate, having crystal indices in the (100) phase, and having p-type and n-type diffused resistors formed therein. A diffused resistance gauge is formed of the p-type and n-type resistors. Temperature compensation means are formed adjacent the resistance gauge in the substrate.

4 Claims, 3 Drawing Sheets

PIEZORESISTIVE STRAIN SENSING DEVICE

BACKGROUND OF THE INVENTION

1. Field of the Invention

The present invention relates to a piezoresistive strain sensing device in which diffused resistors are formed in a semiconductor single-crystal substrate. More particularly, it relates to a piezoresistive strain sensing device which is well suited to sensitively and precisely detect a stress field acting on an IC chip within a semiconductor package.

2. Description of the Prior Art

Prior art devices wherein a mechanical stress resulting from the application of a strain, is converted into an electric signal by utilizing the piezoresistance effect of a semiconductor, include, for example, a semiconductor strain sensor as disclosed in the official gazette of Japanese Patent Application Laid-open No. 56-140229. In this device, a bridge circuit is formed by diffused resistors on a diaphragm of silicon, and a strain is measured by detecting the fractional change in resistivity based on the deformation of the diaphragm attendant upon a surface strain. Another prior art device has been attempted in which a diffused resistor is formed on a silicon substrate, and the substrate is buried in a resin which acts as sensing means, thereby to detect a two-dimensional stress field acting within a surface formed with the diffused resistor. In either case, however, only the detection on a specified stress component is achieved, and the use is limited. A three-dimensional stress field exists in a general structure, and mechanical strain-electricity transducers including the prior-art semiconductor strain sensors have had the problem that the three-dimensional stress field cannot be separately detected.

SUMMARY OF THE INVENTION

An object of the present invention is to provide a piezoresistive strain sensing device which sensitively and precisely detects a stress field acting in a semiconductor device.

The semiconductor pressure conversion device according to the present invention is formed on a semiconductor single-crystal substrate and consists of a diffusion resistance gauge composed of a combination of p-type and n-type diffusion resistance layers, and of a temperature detecting unit composed of a combination of p-type and n-type diffusion layers.

In general, the piezoresistance effect in a semiconductor such as silicon is expressed as:

$$\delta \rho_i = \sum_{k=1}^{6} \pi_{ik} X_k \quad (i = 1 - 6) \qquad (1)$$

using a resistivity $\rho$ and a stress tensor $X$ each of which is denoted by a tensor of the second order, and a tensor $\pi$ of the fourth order.

Since, in general, the tensor of the second order such as $\rho$ or $X$ is given by a six-component vector notation, the tensor $\pi$ of the fourth order is expressed as a 6×6-element tensor. Here, $\pi_{ik}$ is called the "components of the piezoresistance tensor" and consists, in general, of 21 independent components. The number of the independent components decreases in a crystal of good symmetry, and it becomes 3 ($\pi_{11}$, $\pi_{12}$, $\pi_{44}$) in a crystal having the cubic symmetry such as silicon or germanium.

Since (100) crystallographic plane substrates are generally used for manufacturing IC's, assume in this type of substrate a three-orthogonal x-y-z axis system in which the (100) crystallographic plane defines the x-y plane, and the [001] crystallographic axis and the x-axis are coincident with each other. Under this condition, the piezoresistive effects observed at diffusion resistors formed in parallel with the (100) crystallographic plane are expressed as follows:

$$\delta \rho_{xx} J \quad \pi_{11}\sigma_x + \pi_{12}\sigma_y + \pi_{12}\sigma_x \qquad (2)$$

$$\delta \rho_{vv} J \quad \pi_{12}\sigma_x + \pi_{11}\sigma_y + \pi_{12}\sigma_x$$

$$\delta \rho_{xv} J \quad \pi_{44} \tau_{xy}$$

where, $\delta \rho_{ij}$ is a resistance value change rate calculated from a voltage measured in the j-direction when a current is applied in the i-direction of each diffusion resistor; $\sigma_x$, $\sigma_y$, $\sigma_z$ are stress components along the three axis, respectively; $\tau_{xy}$ is a shearing stress component in the x-y plane; and $\pi_{11}$, $\pi_{12}$, and $\pi_{44}$ are proportional constants (piezoresistance coefficients).

Accordingly, stress components which affect the fractional changes of resistivity of the diffused resistor of the (100) planes are four components ($\sigma_x$, $\sigma_v \Psi \sigma_z$, $\sigma_{xy}$), and the resistivity changes which are independently detectible are of three components ($\delta \rho_{xx}$, $\delta \rho_{yy}$, $\delta \rho_{xy}$)001, so that the stress field acting in the crystal plane cannot be uniquely determined. Since, however, the piezoresistance coefficients ($\pi_{11}$, $\pi_{12}$, and $\pi_{44}$) differ depending upon the kinds of dopants used for diffused resistors, the resistivity changes can be independently detected in the respective diffused regions of the p-type diffused resistor and the n-type diffused resistor which are arranged in proximity to each other, the resistivity changes of a maximum of six components can be independently measured in both the regions. Accordingly, p-type and n-type diffused resistors are formed in the (100) plane of a semiconductor substrate whereby four resistor gauges capable of independent measurements can be provided, and the four stress components influential on the resistivity changes can be uniquely determined.

DETAILED DESCRIPTION OF THE PREFERRED EMBODIMENTS

Figure 1:
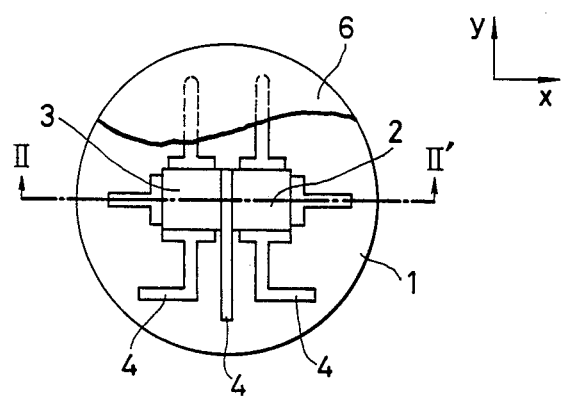
FIG. 1 is a plan view of a first embodiment of a piezoresistive strain sensing device according to the present invention.
Figure 2:
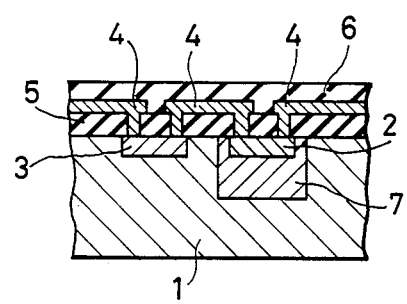
FIG. 2 is a sectional view taken along line II—II' in FIG. 1.

One embodiment of a piezoresistive strain sensing device according to the present invention will be described with reference to FIGS. 1 and 2. In this embodiment, a strain sensor is constructed by making a p-type diffused resistor 3 and an n-type diffused resistor 2 on an n-type silicon (100) substrate 1 by a use of the CMOS process. FIG. 1 shows a plan view, while FIG. 2 shows a sectional view taken along line II—II' in FIG. 1 and illustrates the formed states of the diffused resistors. The p-type diffused resistor 3 and the n-type diffused resistor 2, which are buried in a p-type diffused resistor layer 7, are respectively made in the shape of rectangles in proximity to each other, and electrode terminals 4 are provided on the four sides of each rectangle. The electrode terminals 4 are isolated by an $SiO_2$ film 5, and the whole surface is covered with a passivation film 6. Regarding the directions of the sides of the rectangles, the direction along the line II—II' is set to be the x-direction, and the direction orthogonal thereto in the same plane is set to be the y-direction. A method of measuring the changes of a resistivity in each diffused resistor will be described. Current is caused to flow across the two electrodes opposing in the x-direction, and the potential difference across both the electrodes is measured, whereby $\delta\rho_{xx}$ in the equation (2) mentioned before is measured. A similar method is performed across the two electrodes opposing in the y-direction, whereby $\delta\rho_{yy}$ in equation (2) is measured. In addition, current is caused to flow across the electrodes opposing in the x-direction, and the potential difference across the electrodes opposing in the y-direction is measured, whereby $\delta\rho_{xy}$ in equation (2) is determined. Thus, the resistivity changes of the three independent components can be measured with the single diffused resistor. When $\delta\rho_{xy}$ is measured with either of the p-type and n-type diffused resistors, and three of $\delta\rho_{nxx}$, $\delta\rho_{nyy}$, $\delta\rho_{pxx}$ and $\delta\rho_{pyy}$ are measured, four independent resistivity changes can be measured within the single crystal plane.

According to the present embodiment, four independent resistivity changes can be measured within the (100) crystal plane of silicon, and this allows for the stresses $\sigma_x$ and $\sigma_y$ in the directions of two axes, a shear stress $\tau_{xy}$ and a stress $\sigma_z$ perpendicular to the plane, which act on the crystal plane, to be uniquely determined.

Figure 3:
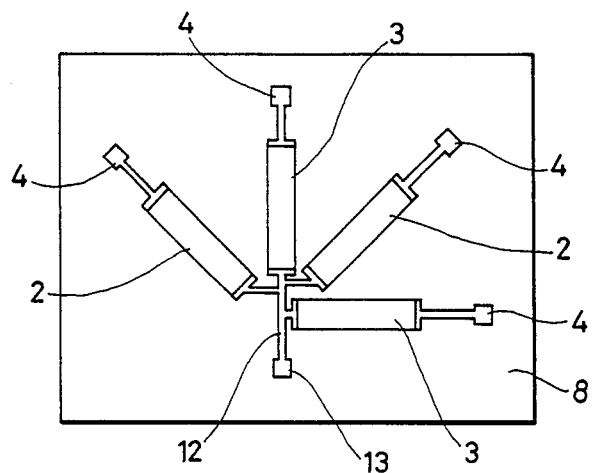
FIG. 3 is a plan view of a second embodiment of the piezoresistive strain sensing device of the present invention.

A second embodiment of the piezoresistive strain sensing device of the present invention will be described with reference to FIG. 3. This figure shows a plan view of a thin-film stress/strain sensor to which the present invention is applied. A single-crystal thin film of silicon having the (100) plane is formed on a film substrate (of, for example, PIQ) 8, and p-type diffused resistors 3 and n-type diffused resistors 2 are formed as shown in the figure. One end of each of these diffused resistors 2 and 3 are connected by a common pattern 12, and are held in communication with a common electrode terminal 13. The single-crystal thin film is produced by a thin-film manufacturing process such as vacuum evaporation, CVD (Chemical Vapored Deposition), sputtering evaporation or epitaxial growth. Here, when the p-type diffused resistors 3 are arranged along the conventional crystal axis <011> and the n-type diffused resistors 2 along <001>, the resistivity changes of the respective resistors are expressed as:

$$\begin{aligned}
\delta\rho_{(p)} &= \tfrac{1}{2}(\pi_{11} + \pi_{12})(\sigma_x + \sigma_y) + \\
&\quad \pi_{12}\sigma_z \pm (\pi_{11} - \pi_{12})\tau_{xy} \\
\delta\rho_{(n)} &= \tfrac{1}{2}(\pi_{11} + \pi_{12} \pm \pi_{44})\sigma_x + \\
&\quad \tfrac{1}{2}(\pi_{11} + \pi_{12} \pm \pi_{44})\sigma_y + \pi_{12}\sigma_z
\end{aligned} \quad (3)$$

In equation (3), $\pi_{ij}$ denotes a piezoresistance coefficient in the case where the direction of the <001> crystal axis is brought into agreement with the directions of the three right-angled axes. Since the resistivity changes in the p-type diffused resistors 3 and the n-type diffused resistors 2 are independently measured, the four components of stresses ($\sigma_x$, $\sigma_y$, $\sigma_z$, $\sigma_{xy}$) are uniquely determined. From this fact, it is apparent that the thin-film stress/strain sensor for semiconductors can be constructed.

Figure 4:
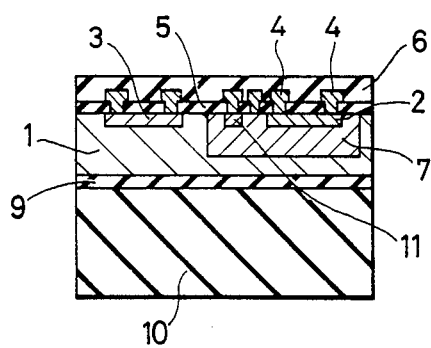
FIG. 4 is a sectional view of a third embodiment of the piezoresistive strain sensing device of the present invention.

A third embodiment of the piezoresistive strain sensing device of the present invention will be described with reference to FIG. 4. This figure is a sectional view of a semiconductor pressure sensor. In the surface layer of an n-type silicon (100) single-crystal substrate 1 in the shape of a disc, a p-type diffused resistor 3 and an n-type diffused resistor 2 are formed to construct a gauge. The single-crystal substrate 1 is bonded to a glass substratum 10 by a low-melting glass 9. Further, an n+-type diffused resistor 11 is formed in a p-type diffused layer 7, to construct a p/n-junction, whereupon the temperature of the gauge is detected. Thus, a temperature compensation circuit is formed, and measurements in a wide temperature range become possible. Moreover, since the silicon substrate may be in the shape of a disc, a high degree of etching accuracy as in the case of making a diaphragm is dispensed with, so that enhanced production percentage is achieved.

According to the embodiments thus far described, since four resistivity changes within the (100) crystal plane of a semiconductor can be measured, it is possible to realize a piezoresistive strain sensing device which can uniquely determine the four stress components acting on the (100) crystal plane; stress components in the directions of three right-angled axes, two of them being contained in the plane, and a shear stress acting within the plane.

Figure 5:
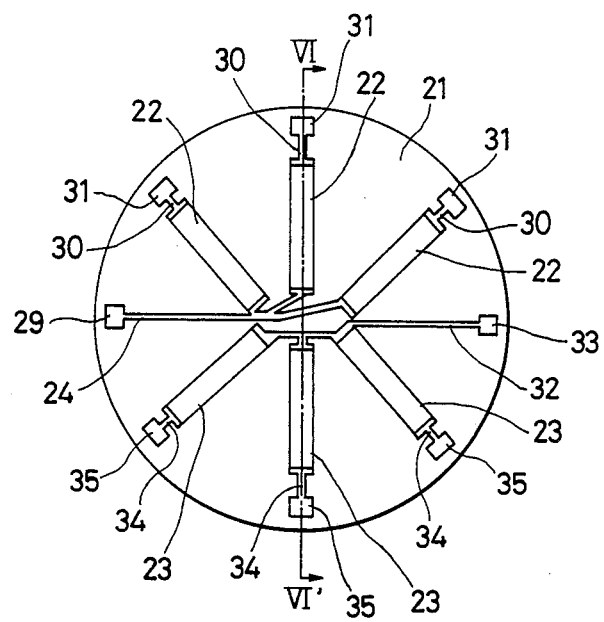
FIG. 5 is a plan view of a fourth embodiment of the piezoresistive strain sensing device of the present invention.
Figure 6:
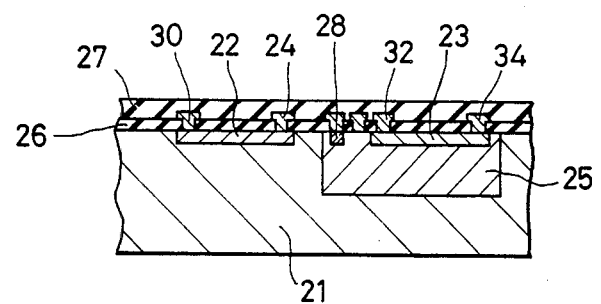
FIG. 6 is a sectional view taken along line VI—VI' in FIG. 5.

A fourth embodiment of the piezoresistive strain sensing device of the present invention will be described with reference to FIGS. 5 and 6. This embodiment is a stress sensor which is fabricated using an n-type silicon (111) single-crystal disc 21 as a substrate FIG. 5 is a plan view, while FIG. 6 is a schematic sectional view taken along line VI—VI' in FIG. 5. Six diffused resistors 22 and 23 formed on the substrate 21 consist of three p-type diffused layers 22 and three n-type diffused layers 23. One end of each of the respective layers 22 or 23 is connected by a single aluminum pattern 24 or 32. It is assumed that the individual diffused resistors 22 or 23 be formed at angular intervals of 45°. It is also assumed that the direction of the line VI—VI' agrees with the direction of the <112> crystal axis. One end of each of the three p-type diffused resistors 22 is connected to a common electrode terminal 29 through the single common Al pattern 24, whereas the other ends thereof are connected to separate electrode terminals 31 through separate Al patterns 30. Likewise, one end of each of the three n-type diffused resistors 23 is connected to a common electrode terminal 33 through the single common Al pattern 32, whereas the other ends thereof are connected to separate electrode terminals 35 through separate Al patterns 34. The n-type diffused resistors 23 are formed in a p-type diffused layer 25. In addition, the Al patterns 24 etc. are isolated by an $SiO_2$ insulator film 26, and the whole surface is covered with a passivation film 27. The p-type diffused layer 25 is formed with an n-type diffused resistor 28, to simultaneously make a p/n-junction for temperature compensation. Now, the operation of this sensor will be described.

The three right-angled axes are given with the x-direction being the direction of the line VI—VI', the y-direction being a direction orthogonal thereto within the plane and the z-direction being a direction perpendicular to the plane, and stresses in the axial directions and shear stresses within respective planes are respectively denoted by $\sigma$ and $\tau$. In FIG. 5, a resistivity on the line VI—VI' is denoted by $\rho_2$, that on the left side thereof is denoted by $\rho_1$, and that on the right side thereof is denoted by $\rho_3$. Then, the corresponding resistivity changes are expressed as:

$$\begin{aligned}\delta\rho_1 &= \pi_\alpha (\sigma_x + \sigma_y) + \pi_\beta \sigma_z + \pi_\gamma \tau_{xy} + \pi_\eta \tau_{yz} \\ \delta\rho_2 &= \pi_\gamma \sigma_x + \pi_\mu \tau_y + \pi_\epsilon \sigma_z - \pi_\eta \tau_{zx} \\ \delta\rho_3 &= \pi_\alpha (\sigma_x + \sigma_y) + \pi_\beta \sigma_z - \pi_\gamma \tau_{xy} + \pi_\eta \tau_{yz}\end{aligned} \quad (4)$$

For diffused resistors of the p-type diffused layers 22 and those of the n-type diffused layers 23, the values of the piezoresistance coefficients $\pi_i$ ($i=\alpha, \beta, \ldots$) are different, so that six sorts of independent resistivity changes can be measured. Since stress components contributing to the respective resistivity changes are of six sorts, the respective components of the stress tensor or the three-dimensional stress field are/is separately detected by solving the matrix of equation (1).

The embodiment thus far described shows that a sensor for detecting a three-dimensional stress field can be realized, and that measurements at temperatures in a wide range are permitted by utilizing a p/n-junction for temperature compensation.

In the foregoing embodiment, the individual diffused resistors 22 or 23 are formed at the angular intervals of 45°. This means that, on the (111) crystal plane, the lengthwise directions of the resistor layers are brought into agreement with the <112> crystal axis and the <110> crystal axis, while one resistor layer is arranged in the direction of 45° between them. In principle, however, the directions of the arrangement of the resistor layers may be as desired (except a case where two or more resistors become parallel among the same kind of diffused resistor layers).

Although three diffused resistors of each type of conductivity are shown in FIG. 5, the number of resistors of each conductivity type may well be four or more. Since the number of stress components acting independently is six, the stress components are uniquely determined when there are at least three diffused resistors of each conductivity type, namely, at least six resistors in total. In the case of forming at least four diffused resistors of the same conductivity type, at least three of them may extend in crystal orientations differing from one another.

In an actual measurement, changes in the resistivities of the diffused resistors are respectively detected.

In each of the foregoing embodiments, the semiconductor single-crystal substrate may be replaced with a single-crystal thin film produced by a thin-film manufacturing process such as vacuum evaporation, CVD, sputtering or epitaxial growth.

According to each embodiment described above, six sorts of independent resistivity changes caused by the piezoresistance effect can be detected on the same semiconductor single-crystal substrate and hence, a stress sensor for determining a three-dimensional stress field can be realized.

What is claimed is:

1. A piezoresistive strain sensing device comprising a semiconductor single-crystal substrate which has crystal indices in the (100) plane, first p-type diffused resistors and first n-type diffused resistors formed in said substrate, a diffused resistance gauge being constructed of said first p-type and first n-type diffused resistors, and further comprising a temperature compensation means which consists of second p-type diffused resistors and second n-type diffused resistors, formed in said semiconductor single-crystal substrate adjacent said diffused resistance gauge, wherein said first p-type diffused resistors and said first n-type diffused resistors are formed in the shape of rectangles, the strain sensing device further comprising electrode terminals provided on the four sides of each rectangle.

2. A piezoresistive strain sensing device according to claim 1, wherein said semiconductor single-crystal substrate is a single-crystal thin film.

3. A piezoresistive strain sensing device according to claim 1, wherein each of said first p-type diffused resistors is arranged in a direction of a crystal axis, and each of said first n-type diffused resistors is arranged in a directon of a crystal axis, and further wherein a first end of each of said first p-type and said first n-type diffused resistors are held electrically connected to a common electrode terminal, while each of the other ends of said first p-type and said first n-type diffused resistors are electrically connected to independent electrode terminals.

4. A piezoresistive strain sensing device comprising a semiconductor single-crystal substrate which has crystal indices in the (100) plane, first p-type diffused resistors and first n-type diffused resistors formed in said substrate, a diffused resistance gauge being constructed of said first p-type and first n-type diffused resistors, and further comprising a temperature compensation means which consists of second p-type diffused resistors and second n-type diffused resistors, formed in said semiconductor single-crystal substrate adjacent said diffused resistance gauge, wherein each of said first p-type diffused resistors is arranged in a direction of a crystal axis, and each of said first n-type diffused resistors is arranged in a direction of crystal axis, and further wherein a first end of each of said first p-type and said first n-type diffused resistors are held electrically connected to a common electrode terminal, while each of the other ends of said first p-type and said first n-type diffused resistors are electrically connected to independent electrode terminals.

* * * * *